(12) United States Patent
Caldara et al.

(10) Patent No.: US 6,195,764 B1
(45) Date of Patent: Feb. 27, 2001

(54) DATA ENCODER/DECODER FOR A HIGH SPEED SERIAL LINK

(75) Inventors: Stephen A. Caldara, Sudbury; Michael Sluyski, Maynard; Raymond L. Strouble, Westford, all of MA (US)

(73) Assignees: Fujitsu Network Communications, Inc., Richardson, TX (US); Fujitsu Limited, Kanagawa-ken (JP)

( * ) Notice: Subject to any disclaimer, the term of this patent is extended or adjusted under 35 U.S.C. 154(b) by 0 days.

(21) Appl. No.: 09/013,959

(22) Filed: Jan. 27, 1998

Related U.S. Application Data

(60) Provisional application No. 60/036,617, filed on Jan. 30, 1997.

(51) Int. Cl.[7] .................................................. H02H 3/05
(52) U.S. Cl. .............................. 714/30; 714/726; 714/8; 714/729; 710/72; 710/20; 717/1; 717/10; 703/13; 703/21; 364/265; 364/267
(58) Field of Search ................................. 714/30, 726, 8, 714/25, 729, 735; 395/182, 183; 364/265, 267, 268; 710/72, 20, 62; 717/1, 10, 9, 4; 703/13, 16, 21

(56) References Cited

U.S. PATENT DOCUMENTS

| | | | |
|---|---|---|---|
| 3,577,142 | 5/1971 | McMillin | 340/347 DD |
| 3,594,360 | 7/1971 | Gaeth | 260/94.3 |
| 3,798,635 | 3/1974 | Candiani | 340/347 DD |
| 4,309,694 | 1/1982 | Henry | 340/347 DD |
| 4,387,364 | 6/1983 | Shirota | 340/347 |
| 4,486,739 | 12/1984 | Franaszek et al. | 340/347 DD |
| 4,520,346 | 5/1985 | Shimada | 340/347 DD |

(List continued on next page.)

OTHER PUBLICATIONS

J.M. Griffiths, Binary Code Suitable for Line Transmission, Post Office Research Station, Dollis Hill, London NW2, England, pp. 79–81, Jan. 28th, 1969.
T. Horiguchi and K. Morita, An Optimization of Modulation Codes in Digital Recording, Central Research Lab, Nippon Electric Co., Ltd., Kawasaki, Japan; *IEEE Transactions on Magnetics*, vol. MAG–12, No. 6, pp. 740–747, Nov. 1976.
R. G. Kiwimagi, Encoding/Decoding for Magnetic Record Storage Appartus, *IBM Technical Disclosure Bulleting*, vol. 18, No. 10, pp. 3147–3149, Mar. 1976.
W.W. Peterson, and D.T. Brown, Cyclic Codes for Error Detection, *Proceeding of the IRE*, pp. 228–234; (Jan. 1961).
Paul F. Nee et al., Method for Compacting Vector Generation Data, Business Machines Corporation, Armenk, N.Y. Defensive Publication of the United States Patent Office, Jan. 7, 1975.
John F. Wakerly, Block Diagram Standards, Article from Chapter 2 of the book, Logic Design Projects Using Standard Integrated Circuit, by permission of the publisher, John Wiley & Sons, Inc. pp. 75–85, copyright 1976.

* cited by examiner

*Primary Examiner*—Ayaz R. Sheikh
*Assistant Examiner*—Firmin Backer
(74) *Attorney, Agent, or Firm*—Weingarten, Schurgin, Gagnebin & Hayes LLP

(57) ABSTRACT

An encoder/decoder is disclosed which is operative to convert an 8 bit value to a ten bit serial run length limited code for transmission over a serial data link. The encoding technique maintains DC balance within 2 bits over a single ten bit word and compensates for DC imbalance by inverting selected words in the transmission sequence to correct for a DC imbalance resulting from the transmission of a prior unbalanced word. One or more encoding lookup tables are employed at the encoder to map each byte into a ten bit run length limited code for serialization and transmission over the serial data link. A second decoding lookup table is employed at the decoder to map the received 10 bit run length limited code into the original 8 bit value.

8 Claims, 14 Drawing Sheets

U.S. PATENT DOCUMENTS

| | | | |
|---|---|---|---|
| 4,523,181 | 6/1985 | Tazaki et al. | 340/347 |
| 4,665,517 | 5/1987 | Widmer | 370/86 |
| 4,675,650 | 6/1987 | Coppersmith et al. | 340/347 DD |
| 4,677,421 | 6/1987 | Taniyama | 340/347 |
| 4,725,815 | 2/1988 | Mitchell et al. | 340/347 DD |
| 4,728,929 * | 3/1988 | Tanaka | 341/73 |
| 4,779,072 | 10/1988 | van Gestel | 341/59 |
| 4,916,605 | 4/1990 | Beardsley et al. | 364/200 |
| 5,122,912 | 6/1992 | Kanota et al. | 360/46 |
| 5,200,979 | 4/1993 | Harris | 375/19 |
| 5,319,782 | 6/1994 | Goldberg et al. | 395/650 |
| 5,396,239 * | 3/1995 | McMahon et al. | 341/58 |
| 5,659,310 * | 8/1997 | McLaughlin | 341/59 |
| 5,703,580 * | 12/1997 | Ko | 341/59 |
| 5,742,243 * | 4/1998 | Moriyama | 341/59 |
| 5,757,293 * | 5/1998 | McLaughlin | 341/59 |
| 5,774,078 * | 6/1998 | Tanaka et al. | 341/68 |
| 6,002,718 * | 12/1999 | Roth | 375/240 |

TABLE 0

| INPUT | OUTPUT | Balance | INPUT | OUTPUT | Balance |
|---|---|---|---|---|---|
| 000000 | 0001011011 | 0 | 100000 | 0010101110 | 0 |
| 000001 | 0001111011 | 2 | 100001 | 0101011110 | 2 |
| 000010 | 0001011101 | 0 | 100010 | 0010110011 | 0 |
| 000011 | 0010111011 | 2 | 100011 | 0101101011 | 2 |
| 000100 | 0001011110 | 0 | 100100 | 0010110101 | 0 |
| 000101 | 0010111101 | 2 | 100101 | 0101101101 | 2 |
| 000110 | 0001101011 | 0 | 100110 | 0010110110 | 0 |
| 000111 | 0011011011 | 2 | 100111 | 0101101110 | 2 |
| 001000 | 0001101101 | 0 | 101000 | 0010111001 | 0 |
| 001001 | 0011011101 | 2 | 101001 | 0101110011 | 2 |
| 001010 | 0001101110 | 0 | 101010 | 0010111010 | 0 |
| 001011 | 0011011110 | 2 | 101011 | 0101110101 | 2 |
| 001100 | 0001110011 | 0 | 101100 | 0010111100 | 0 |
| 001101 | 0011101011 | 2 | 101101 | 0101110110 | 2 |
| 001110 | 0001110101 | 0 | 101110 | 0011001011 | 0 |
| 001111 | 0011101101 | 2 | 101111 | 0101111001 | 2 |
| 010000 | 0001110110 | 0 | 110000 | 0011001101 | 0 |
| 010001 | 0011101110 | 2 | 110001 | 0101111010 | 2 |
| 010010 | 0001111001 | 0 | 110010 | 0011001110 | 0 |
| 010011 | 0011110011 | 2 | 110011 | 0110011011 | 2 |
| 010100 | 0001111010 | 0 | 110100 | 0011010011 | 0 |
| 010101 | 0011110101 | 2 | 110101 | 0110011101 | 2 |
| 010110 | 0010011011 | 0 | 110110 | 0011010101 | 0 |
| 010111 | 0011110110 | 2 | 110111 | 0110011110 | 2 |
| 011000 | 0010011101 | 0 | 111000 | 0011010110 | 0 |
| 011001 | 0100111011 | 2 | 111001 | 0110101011 | 2 |
| 011010 | 0010011110 | 0 | 111010 | 0011011001 | 0 |
| 011011 | 0100111101 | 2 | 111011 | 0110101101 | 2 |
| 011100 | 0010101011 | 0 | 111100 | 0011011010 | 0 |
| 011101 | 0101011011 | 2 | 111101 | 0110101110 | 2 |
| 011110 | 0010101101 | 0 | 111110 | 0011011100 | 0 |
| 011111 | 0101011101 | 2 | 111111 | 0110110011 | 2 |

Fig. 5a

TABLE 1

| INPUT | OUTPUT | INPUT | OUTPUT |
|---|---|---|---|
| 000000 | 0011100011 | 100000 | 0100110101 |
| 000001 | 0110110101 | 100001 | 0111100110 |
| 000010 | 0011100101 | 100010 | 0100110110 |
| 000011 | 0110110110 | 100011 | 0111101001 |
| 000100 | 0011100110 | 100100 | 0100111001 |
| 000101 | 0110111001 | 100101 | 0111101010 |
| 000110 | 0011101001 | 100110 | 0100111010 |
| 000111 | 0110111010 | 100111 | 0111101100 |
| 001000 | 0011101010 | 101000 | 0100111100 |
| 001001 | 0110111100 | 101001 | 1000111011 |
| 001010 | 0011101100 | 101010 | 0101001011 |
| 001011 | 0111001011 | 101011 | 1000111101 |
| 001100 | 0011110001 | 101100 | 0101001101 |
| 001101 | 0111001101 | 101101 | 1001011011 |
| 001110 | 0011110010 | 101110 | 0101001110 |
| 001111 | 0111001110 | 101111 | 1001011101 |
| 010000 | 0011110100 | 110000 | 0101010011 |
| 010001 | 0111010011 | 110001 | 1001011110 |
| 010010 | 0100011011 | 110010 | 0101010101 |
| 010011 | 0111010101 | 110011 | 1001101011 |
| 010100 | 0100011101 | 110100 | 0101010110 |
| 010101 | 0111010110 | 110101 | 1001101101 |
| 010110 | 0100011110 | 110110 | 0101011001 |
| 010111 | 0111011001 | 110111 | 1001101110 |
| 011000 | 0100101011 | 111000 | 0101011010 |
| 011001 | 0111011010 | 111001 | 1001110011 |
| 011010 | 0100101101 | 111010 | 0101011100 |
| 011011 | 0111011100 | 111011 | 1001110101 |
| 011100 | 0100101110 | 111100 | 0101100011 |
| 011101 | 0111100011 | 111101 | 1001110110 |
| 011110 | 0100110011 | 111110 | 0101100101 |
| 011111 | 0111100101 | 111111 | 1001111001 |

Fig. 5b

TABLE 2

| INPUT | OUTPUT | INPUT | OUTPUT |
|---|---|---|---|
| 000000 | 0101100110 | 100000 | 0110100011 |
| 000001 | 1001111010 | 100001 | 1011010011 |
| 000010 | 0101101001 | 100010 | 0110100101 |
| 000011 | 1010011011 | 100011 | 1011010101 |
| 000100 | 0101101010 | 100100 | 0110100110 |
| 000101 | 1010011101 | 100101 | 1011010110 |
| 000110 | 0101101100 | 100110 | 0110101001 |
| 000111 | 1010011110 | 100111 | 1011011001 |
| 001000 | 0101110001 | 101000 | 0110101010 |
| 001001 | 1010101011 | 101001 | 1011011010 |
| 001010 | 0101110010 | 101010 | 0110101100 |
| 001011 | 1010101101 | 101011 | 1011011100 |
| 001100 | 0101110100 | 101100 | 0110110001 |
| 001101 | 1010101110 | 101101 | 1011100011 |
| 001110 | 0110001011 | 101110 | 0110110010 |
| 001111 | 1010110011 | 101111 | 1011100101 |
| 010000 | 0110001101 | 110000 | 0110110100 |
| 010001 | 1010110101 | 110001 | 1011100110 |
| 010010 | 0110001110 | 110010 | 0111000011 |
| 010011 | 1010110110 | 110011 | 1011101001 |
| 010100 | 0110010011 | 110100 | 0111000101 |
| 010101 | 1010111001 | 110101 | 1011101010 |
| 010110 | 0110010101 | 110110 | 0111000110 |
| 010111 | 1010111010 | 110111 | 1011101100 |
| 011000 | 0110010110 | 111000 | 0111001001 |
| 011001 | 1010111100 | 111001 | 1011110001 |
| 011010 | 0110011001 | 111010 | 0111001010 |
| 011011 | 1011001011 | 111011 | 1011110010 |
| 011100 | 0110011010 | 111100 | 0111001100 |
| 011101 | 1011001101 | 111101 | 1011110100 |
| 011110 | 0110011100 | 111110 | 0111010001 |
| 011111 | 1011001110 | 111111 | 1100011011 |

Fig. 5c

TABLE 3

| INPUT | OUTPUT | INPUT | OUTPUT |
|---|---|---|---|
| 000000 | 0111010010 | 100000 | 1000111100 |
| 000001 | 1100011101 | 100001 | 1101010110 |
| 000010 | 0111010100 | 100010 | 1001001011 |
| 000011 | 1100011110 | 100011 | 1101011001 |
| 000100 | 0111100001 | 100100 | 1001001101 |
| 000101 | 1100101011 | 100101 | 1101011010 |
| 000110 | 0111100010 | 100110 | 1001001110 |
| 000111 | 1100101101 | 100111 | 1101011100 |
| 001000 | 0111100100 | 101000 | 1001010011 |
| 001001 | 1100101110 | 101001 | 1101100011 |
| 001010 | 1000011011 | 101010 | 1001010101 |
| 001011 | 1100110011 | 101011 | 1101100101 |
| 001100 | 1000011101 | 101100 | 1001010110 |
| 001101 | 1100110101 | 101101 | 1101100110 |
| 001110 | 1000011110 | 101110 | 1001011001 |
| 001111 | 1100110110 | 101111 | 1101101001 |
| 010000 | 1000101011 | 110000 | 1001011010 |
| 010001 | 1100111001 | 110001 | 1101101010 |
| 010010 | 1000101101 | 110010 | 1001011100 |
| 010011 | 1100111010 | 110011 | 1101101100 |
| 010100 | 1000101110 | 110100 | 1001100011 |
| 010101 | 1100111100 | 110101 | 1101110001 |
| 010110 | 1000110011 | 110110 | 1001100101 |
| 010111 | 1101001011 | 110111 | 1101110010 |
| 011000 | 1000110101 | 111000 | 1001100110 |
| 011001 | 1101001101 | 111001 | 1101110100 |
| 011010 | 1000110110 | 111010 | 1001101001 |
| 011011 | 1101001110 | 111011 | 1110001011 |
| 011100 | 1000111001 | 111100 | 1001101010 |
| 011101 | 1101010011 | 111101 | 1110001101 |
| 011110 | 1000111010 | 111110 | 1001101100 |
| 011111 | 1101010101 | 111111 | 1110001110 |

Fig. 5d

| TEN BIT CODE | TEN BIT CODE COMP. | EIGHT BIT CODE |
|---|---|---|
| 0001011011 |  | 00000000_0 |
| 0001111011 | 1110000100 | 00000001_0 |
| 0001011101 |  | 00000010_0 |
| 0010111011 | 1101000100 | 00000011_0 |
| 0001011110 |  | 00000100_0 |
| 0010111101 | 1101000010 | 00000101_0 |
| 0001101011 |  | 00000110_0 |
| 0011011011 | 1100100100 | 00000111_0 |
| 0001101101 |  | 00001000_0 |
| 0011011101 | 1100100010 | 00001001_0 |
| 0001101110 |  | 00001010_0 |
| 0011011110 | 1100100001 | 00001011_0 |
| 0001110011 |  | 00001100_0 |
| 0011101011 | 1100010100 | 00001101_0 |
| 0001110101 |  | 00001110_0 |
| 0011101101 | 1100010010 | 00001111_0 |
| 0001110110 |  | 00010000_0 |
| 0011101110 | 1100010001 | 00010001_0 |
| 0001111001 |  | 00010010_0 |
| 0011110011 | 1100001100 | 00010011_0 |
| 0001111010 |  | 00010100_0 |
| 0011110101 | 1100001010 | 00010101_0 |
| 0010011011 |  | 00010110_0 |
| 0011110110 | 1100001001 | 00010111_0 |
| 0010011101 |  | 00011000_0 |
| 0100111011 | 1011000100 | 00011001_0 |
| 0010011110 |  | 00011010_0 |
| 0100111101 | 1011000010 | 00011011_0 |
| 0010101011 |  | 00011100_0 |
| 0101011011 | 1010100100 | 00011101_0 |
| 0010101101 |  | 00011110_0 |
| 0101011101 | 1010100010 | 00011111_0 |
| 0010101110 |  | 00100000_0 |
| 0101011110 | 1010100001 | 00100001_0 |
| 0010110011 |  | 00100010_0 |
| 0101101011 | 1010010100 | 00100011_0 |
| 0010110101 |  | 00100100_0 |
| 0101101101 | 1010010010 | 00100101_0 |
| 0010110110 |  | 00100110_0 |
| 0101101110 | 1010010001 | 00100111_0 |
| 0010111001 |  | 00101000_0 |
| 0101110011 | 1010001100 | 00101001_0 |
| 0010111010 |  | 00101010_0 |
| 0101110101 | 1010001010 | 00101011_0 |
| 0010111100 |  | 00101100_0 |
| 0101110110 | 1010001001 | 00101101_0 |
| 0011001011 |  | 00101110_0 |
| 0101111001 | 1010000110 | 00101111_0 |
| 0011001101 |  | 00110000_0 |

Fig. 6a

| TEN BIT CODE | TEN BIT COMPLEMENT | EIGHT BIT CODE |
|---|---|---|
| 0101111010 | 1010000101 | 00110001_0 |
| 0011001110 | | 00110010_0 |
| 0110011011 | 1001100100 | 00110011_0 |
| 0011010011 | | 00110100_0 |
| 0110011101 | 1001100010 | 00110101_0 |
| 0011010101 | | 00110110_0 |
| 0110011110 | 1001100001 | 00110111_0 |
| 0011010110 | | 00111000_0 |
| 0110101011 | 1001010100 | 00111001_0 |
| 0011011001 | | 00111010_0 |
| 0110101101 | 1001010010 | 00111011_0 |
| 0011011010 | | 00111100_0 |
| 0110101110 | 1001010001 | 00111101_0 |
| 0011011100 | | 00111110_0 |
| 0110110011 | 1001001100 | 00111111_0 |
| 0011100011 | | 01000000_0 |
| 0110110101 | 1001001010 | 01000001_0 |
| 0011100101 | | 01000010_0 |
| 0110110110 | 1001001001 | 01000011_0 |
| 0011100110 | | 01000100_0 |
| 0110111001 | 1001000110 | 01000101_0 |
| 0011101001 | | 01000110_0 |
| 0110111010 | 1001000101 | 01000111_0 |
| 0011101010 | | 01001000_0 |
| 0110111100 | 1001000011 | 01001001_0 |
| 0011101100 | | 01001010_0 |
| 0111001011 | 1000110100 | 01001011_0 |
| 0011110001 | | 01001100_0 |
| 0111001101 | 1000110010 | 01001101_0 |
| 0011110010 | | 01001110_0 |
| 0111001110 | 1000110001 | 01001111_0 |
| 0011110100 | | 01010000_0 |
| 0111010011 | 1000101100 | 01010001_0 |
| 0100011011 | | 01010010_0 |
| 0111010101 | 1000101010 | 01010011_0 |
| 0100011101 | | 01010100_0 |
| 0111010110 | 1000101001 | 01010101_0 |
| 0100011110 | | 01010110_0 |
| 0111011001 | 1000100110 | 01010111_0 |
| 0100101011 | | 01011000_0 |
| 0111011010 | 1000100101 | 01011001_0 |
| 0100101101 | | 01011010_0 |
| 0111011100 | 1000100011 | 01011011_0 |
| 0100101110 | | 01011100_0 |
| 0111100011 | 1000011100 | 01011101_0 |
| 0100110011 | | 01011110_0 |
| 0111100101 | 1000011010 | 01011111_0 |
| 0100110101 | | 01100000_0 |
| 0111100110 | 1000011001 | 01100001_0 |
| 0100110110 | | 01100010_0 |
| 0111101001 | 1000010110 | 01100011_0 |
| 0100111001 | | 01100100_0 |
| 0111101010 | 1000010101 | 01100101_0 |

Fig. 6b

| TEN BIT CODE | TEN BIT CODE COMP. | EIGHT BIT CODE |
|---|---|---|
| 0100111010 | | 01100110_0 |
| 0111101100 | 1000010011 | 01100111_0 |
| 0100111100 | | 01101000_0 |
| 1000111011 | 0111000100 | 01101001_0 |
| 0101001011 | | 01101010_0 |
| 1000111101 | 0111000010 | 01101011_0 |
| 0101001101 | | 01101100_0 |
| 1001011011 | 0110100100 | 01101101_0 |
| 0101001110 | | 01101110_0 |
| 1001011101 | 0110100010 | 01101111_0 |
| 0101010011 | | 01110000_0 |
| 1001011110 | 0110100001 | 01110001_0 |
| 0101010101 | | 01110010_0 |
| 1001101011 | 0110010100 | 01110011_0 |
| 0101010110 | | 01110100_0 |
| 1001101101 | 0110010010 | 01110101_0 |
| 0101011001 | | 01110110_0 |
| 1001101110 | 0110010001 | 01110111_0 |
| 0101011010 | | 01111000_0 |
| 1001110011 | 0110001100 | 01111001_0 |
| 0101011100 | | 01111010_0 |
| 1001110101 | 0110001010 | 01111011_0 |
| 0101100011 | | 01111100_0 |
| 1001110110 | 0110001001 | 01111101_0 |
| 0101100101 | | 01111110_0 |
| 1001111001 | 0110000110 | 01111111_0 |
| 0101100110 | | 10000000_0 |
| 1001111010 | 0110000101 | 10000001_0 |
| 0101101001 | | 10000010_0 |
| 1010011011 | 0101100100 | 10000011_0 |
| 0101101010 | | 10000100_0 |
| 1010011101 | 0101100010 | 10000101_0 |
| 0101101100 | | 10000110_0 |
| 1010011110 | 0101100001 | 10000111_0 |
| 0101110001 | | 10001000_0 |
| 1010101011 | 0101010100 | 10001001_0 |
| 0101110010 | | 10001010_0 |
| 1010101101 | 0101010010 | 10001011_0 |
| 0101110100 | | 10001100_0 |
| 1010101110 | 0101010001 | 10001101_0 |
| 0110001011 | | 10001110_0 |
| 1010110011 | 0101001100 | 10001111_0 |
| 0110001101 | | 10010000_0 |
| 1010110101 | 0101001010 | 10010001_0 |
| 0110001110 | | 10010010_0 |
| 1010110110 | 0101001001 | 10010011_0 |
| 0110010011 | | 10010100_0 |
| 1010111001 | 0101000110 | 10010101_0 |
| 0110010101 | | 10010110_0 |
| 1010111010 | 0101000101 | 10010111_0 |
| 0110010110 | | 10011000_0 |
| 1010111100 | 0101000011 | 10011001_0 |
| 0110011001 | | 10011010_0 |

Fig. 6c

| TEN BIT CODE | TEN BIT CODE COMP. | EIGHT BIT CODE |
|---|---|---|
| 1011001011 | 0100110100 | 10011011_0 |
| 0110011010 | | 10011100_0 |
| 1011001101 | 0100110010 | 10011101_0 |
| 0110011100 | | 10011110_0 |
| 1011001110 | 0100110001 | 10011111_0 |
| 0110100011 | | 10100000_0 |
| 1011010011 | 0100101100 | 10100001_0 |
| 0110100101 | | 10100010_0 |
| 1011010101 | 0100101010 | 10100011_0 |
| 0110100110 | | 10100100_0 |
| 1011010110 | 0100101001 | 10100101_0 |
| 0110101001 | | 10100110_0 |
| 1011011001 | 0100100110 | 10100111_0 |
| 0110101010 | | 10101000_0 |
| 1011011010 | 0100100101 | 10101001_0 |
| 0110101100 | | 10101010_0 |
| 1011011100 | 0100100011 | 10101011_0 |
| 0110110001 | | 10101100_0 |
| 1011100011 | 0100011100 | 10101101_0 |
| 0110110010 | | 10101110_0 |
| 1011100101 | 0100011010 | 10101111_0 |
| 0110110100 | | 10110000_0 |
| 1011100110 | 0100011001 | 10110001_0 |
| 0111000011 | | 10110010_0 |
| 1011101001 | 0100010110 | 10110011_0 |
| 0111000101 | | 10110100_0 |
| 1011101010 | 0100010101 | 10110101_0 |
| 0111000110 | | 10110110_0 |
| 1011101100 | 0100010011 | 10110111_0 |
| 0111001001 | | 10111000_0 |
| 1011110001 | 0100001110 | 10111001_0 |
| 0111001010 | | 10111010_0 |
| 1011110010 | 0100001101 | 10111011_0 |
| 0111001100 | | 10111100_0 |
| 1011110100 | 0100001011 | 10111101_0 |
| 0111010001 | | 10111110_0 |
| 1100011011 | 0011100100 | 10111111_0 |
| 0111010010 | | 11000000_0 |
| 1100011101 | 0011100010 | 11000001_0 |
| 0111010100 | | 11000010_0 |
| 1100011110 | 0011100001 | 11000011_0 |
| 0111100001 | | 11000100_0 |
| 1100101011 | 0011010100 | 11000101_0 |
| 0111100010 | | 11000110_0 |
| 1100101101 | 0011010010 | 11000111_0 |
| 0111100100 | | 11001000_0 |
| 1100101110 | 0011010001 | 11001001_0 |
| 1000011011 | | 11001010_0 |
| 1100110011 | 0011001100 | 11001011_0 |
| 1000011101 | | 11001100_0 |
| 1100110101 | 0011001010 | 11001101_0 |

Fig. 6d

| TEN BIT CODE | TEN BIT CODE COMP. | EIGHT BIT CODE |
|---|---|---|
| 1000011110 | | 11001110_0 |
| 1100110110 | 0011001001 | 11001111_0 |
| 1000101011 | | 11010000_0 |
| 1100111001 | 0011000110 | 11010001_0 |
| 1000101101 | | 11010010_0 |
| 1100111010 | 0011000101 | 11010011_0 |
| 1000101110 | | 11010100_0 |
| 1100111100 | 0011000011 | 11010101_0 |
| 1000110011 | | 11010110_0 |
| 1101001011 | 0010110100 | 11010111_0 |
| 1000110101 | | 11011000_0 |
| 1101001101 | 0010110010 | 11011001_0 |
| 1000110110 | | 11011010_0 |
| 1101001110 | 0010110001 | 11011011_0 |
| 1000111001 | | 11011100_0 |
| 1101010011 | 0010101100 | 11011101_0 |
| 1000111010 | | 11011110_0 |
| 1101010101 | 0010101010 | 11011111_0 |
| 1000111100 | | 11100000_0 |
| 1101010110 | 0010101001 | 11100001_0 |
| 1001001011 | | 11100010_0 |
| 1101011001 | 0010100110 | 11100011_0 |
| 1001001101 | | 11100100_0 |
| 1101011010 | 0010100101 | 11100101_0 |
| 1001001110 | | 11100110_0 |
| 1101011100 | 0010100011 | 11100111_0 |
| 1001010011 | | 11101000_0 |
| 1101100011 | 0010011100 | 11101001_0 |
| 1001010101 | | 11101010_0 |
| 1101100101 | 0010011010 | 11101011_0 |
| 1001010110 | | 11101100_0 |
| 1101100110 | 0010011001 | 11101101_0 |
| 1001011001 | | 11101110_0 |
| 1101101001 | 0010010110 | 11101111_0 |
| 1001011010 | | 11110000_0 |
| 1101101010 | 0010010101 | 11110001_0 |
| 1001011100 | | 11110010_0 |
| 1101101100 | 0010010011 | 11110011_0 |
| 1001100011 | | 11110100_0 |
| 1101110001 | 0010001110 | 11110101_0 |
| 1001100101 | | 11110110_0 |
| 1101110010 | 0010001101 | 11110111_0 |
| 1001100110 | | 11111000_0 |
| 1101110100 | 0010001011 | 11111001_0 |
| 1001101001 | | 11111010_0 |
| 1110001011 | 0001110100 | 11111011_0 |
| 1001101010 | | 11111100_0 |
| 1110001101 | 0001110010 | 11111101_0 |
| 1001101100 | | 11111110_0 |
| 1110001110 | 0001110001 | 11111111_0 |
| Default | | xxxxxxxx_1 |

Fig. 6e

DATA ENCODER/DECODER FOR A HIGH SPEED SERIAL LINK

CROSS REFERENCE TO RELATED APPLICATIONS

The present application claims priority of U.S. Provisional Patent Application Ser. No. 60/036,617, titled DATA ENCODER/DECODER FOR HIGH SPEED SERIAL LINK and filed Jan. 30, 1997.

STATEMENT REGARDING FEDERALLY SPONSORED RESEARCH OR DEVELOPMENT

Not Applicable

BACKGROUND OF THE INVENTION

The present invention generally relates to the transmission of data over a serial data link and more particularly to encoding methods and apparatus for generating DC balanced, run length limited codes for transmission over a serial data link and a decoder for decoding such codes.

Numerous applications exist in which it is desirable to transmit data over a high speed serial data link. Well known problems must be overcome, however, when transmitting data over serial data links at high speed. To maintain a high signal to noise ratio, differential transmitters and receivers are often employed at the transmitting and receiving ends of the serial link. It is well known that it is desirable to maintain the transmitted binary signal generally in a DC balanced state to maintain good common mode rejection characteristics at the receiver. DC balance is maintained by transmitting approximately the same number of binary 1s as 0s over the link. This would not typically occur if data were just randomly transmitted over the serial data link. To obtain a DC balanced signal for transmission over a serial link it is known in the art that encoders and decoders may be employed to assure that a balanced condition is maintained over the link. If transmissions over the serial link are imbalanced (i.e. more binary 1's than 0's or more 0's than 1's) a DC offset may be induced on the serial link which can interfere with the ability of a differential receiver to properly decode the binary digits.

When transmitting data at high speeds over a serial data link it is often impractical or not desirable to provide a separate clock signal for data recovery at the receiver since clock skew may occur. Additionally, it is often desirable to minimize the number of backplane or data link signals and the provision of a separate clock signal necessarily increases the signal count. For this reason, a clock signal is sometimes recovered from the serially transmitted data using a phase locked loop at the receive end of the serial data link. To maintain proper operation of a phase locked loop, however, the input signal to the phase locked loop must exhibit sufficient transitions for the phase locked loop to maintain a lock on the input data frequency. If the received data, for example, comprises a long string of logic 1s or 0s, the absence of transitions renders clock recovery difficult. For this reason, run length limited encoding techniques are employed. A run length limited (RLL) code is an encoded character which has a maximum number of logic 0s or 1s in a row. For example, a digital signal with a run length limit of 5 has a maximum of five consecutive logic 0s or 1s. It is known to select run length limited codes so as to maintain the run length over successive characters. The use of such run length limited encoding technique maintains sufficient clocking transitions to permit clock recovery and recovery of the data stream at the receiver.

A number of encoding techniques have been developed to address the problems associated with the maintenance of DC balance and data stream synchronization using RLL codes. One such technique is disclosed in U.S. Pat. No. 4,486,379 entitled Byte Oriented DC Balanced (0,4) 8B/10B Partitioned Block Transmission Code. The encoding circuit therein disclosed partitions an 8 bit byte of information into 5 bit and 3 bit sub-blocks for encoding purposes. The 5 bit and 3 bit blocks are separately encoded while maintaining DC balance across all block and sub-block boundaries.

It would therefore be desirable to be able to provide a simple, cost effective DC balanced encoder/decoder with a short run length limit to provide improved data transmission and clock recovery over a serial data link.

BRIEF SUMMARY OF THE INVENTION

A data encoding circuit for generating encoded data for transmission over a high speed serial link is disclosed along with a decoding circuit for decoding such encoded data. The encoding/decoding circuits provide transition density and DC balance. A receiver uses a phase locked loop to resynchronize bits in the data transmission stream and hence benefits from the transitions between logic 1s and logic 0s.

In the illustrated embodiment, the encoding circuit employs two encoders in parallel. Each encoder receives an 8 bit input word and generates a 10 bit run length limited output word. Each encoder includes at least one table or map which is employed to convert the eight bit input word to an encoded 10 bit run length limited output word. The encoded output words are selected for use in the tables based on transition density and DC balance criteria. Hence, a predefined transition density is assured.

To obtain the necessary 256 entries for an eight bit input word, all possible balanced (equal number of logic 0 and logic 1 bits) ten bit words are used. However, since fewer than 256 balanced ten bit words exist, a number of ten bit words are employed which are imbalanced by only two bits. DC imbalance is tracked using a weight variable. The 10 bit words in the tables are chosen such that the sign of the imbalance is predictable when imbalance occurs, i.e., it will always be in favor of a particular logic level. When an imbalanced transmission occurs, it is detected. Any subsequent balanced 10 bit word is transmitted normally. However, the next imbalanced ten bit word is inverted prior to transmission to mitigate the detected imbalance. The above described process operates continuously such that DC imbalance is never greater than two bits at any character boundary at the receiver input.

The encoded 10 bit run length limited words are transmitted over the serial link within a packet which includes a preamble, a sync field, a data field and a postamble. The postamble is employed to assure that DC balance is maintained at the completion of the transmission of each packet over the serial link.

The decoding circuit includes tables for mapping the ten bit words, including complimentary imbalanced pairs of words, to the original input eight bit words. In a preferred embodiment, the decoding circuit includes two decodes which operate in parallel. Each decoder performs a verification operation to determine whether the received ten bit code is valid, i.e., contained in the decoder table.

BRIEF DESCRIPTION OF THE SEVERAL VIEWS OF THE DRAWING

The invention will be more fully understood by reference to the following Detailed Description of the Invention taken in conjunction with the Drawing of which:

FIGS. 5a–5d are illustrative lookup tables corresponding to the four illustrated lookup tables illustrated in FIG. 3;

FIGS. 6a–6e are illustrative of an exemplary lookup table employed in the 10b/8b decoder of FIG. 4.

DETAILED DESCRIPTION OF THE INVENTION

U.S. Provisional Patent Application Ser. No. 60/036,617 entitled Data Encoder/Decoder for High-Speed Serial Link filed Jan. 30, 1997, upon which the present application relies for priority, is incorporated herein by reference.

Figure 1:
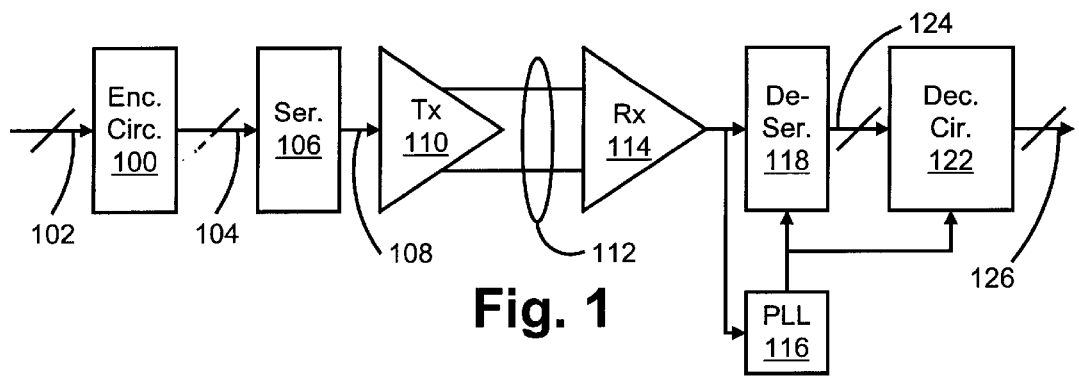
FIG. 1 is a block diagram illustrating encoding/decoding circuits in accordance with the present invention.

The data transmission system for transmitting encoded data over a serial data link and for decoding such data is depicted in FIG. 1. Referring to FIG. 1, eight (8) bit characters are received at the encoding circuit 100 over input signal lines 102. In a preferred embodiment, two 8 bit characters are presented to the encoding circuit 100 in parallel. The two 8 bit characters are converted in parallel within the encoding circuit 100 into two 10 bit run length limited code. The presently disclosed run length limited (RLL) codes have a maximum run length of five bits. Additionally, the run length limited codes produced by the encoding circuit 100 are generally DC balanced. More particularly, the codes produced within the encoding circuit 100 are either balanced, meaning that each code contains five logic 1s and five logic 0s, or are imbalanced by two bits in a single direction; e.g. the imbalanced code has two more binary is than 0s.

The two ten (10) bit outputs from the encoding circuit 100 comprise RLL codes which are selectively coupled via bus 104 to a data serializer 106 within a packetized data structure. The RLL codes are selectively inverted, as hereinafter discussed, to maintain DC balance of the transmitted serial data stream. The serializer 106 produces an output signal on line 108 which comprises a serialized packet which contains the 10 bit RLL codes. The serial output signal line 108 is coupled to a transmitter 110 for transmission of the serial data over the serial data link 112. The serial data link 112 is coupled to a receiver 114 which may comprise a differential receiver. The output of the receiver 114 is coupled to a phase locked loop 116 and a deserializer 118. The phase locked loop 116 provides clock recovery and synchronization functions as known in the art and produces a clock signal 120 which is coupled to the deserializer 118 and a decoder 122.

The deserializer 118 recovers the serialized 10 bit run length limited codes from the packet and generates as an output the 10 bit run length limited codes as discussed in greater detail below. More specifically, the output of the deserializer 118 comprises a 20 bit parallel bus 124 to accommodate two 10 bit RLL codes in parallel. The two 10 bit RLL codes are coupled to respective decoders within the decoding circuit 122 which operate in parallel on the respective 10 bit RLL codes. The decoders within the decoding circuit 122 convert the parallel 10 bit run length limited codes into 8 bit data characters corresponding to the original 8 bit characters appearing on the signal lines 102 prior to encoding and transmission over the serial link 112.

Figure 2A:
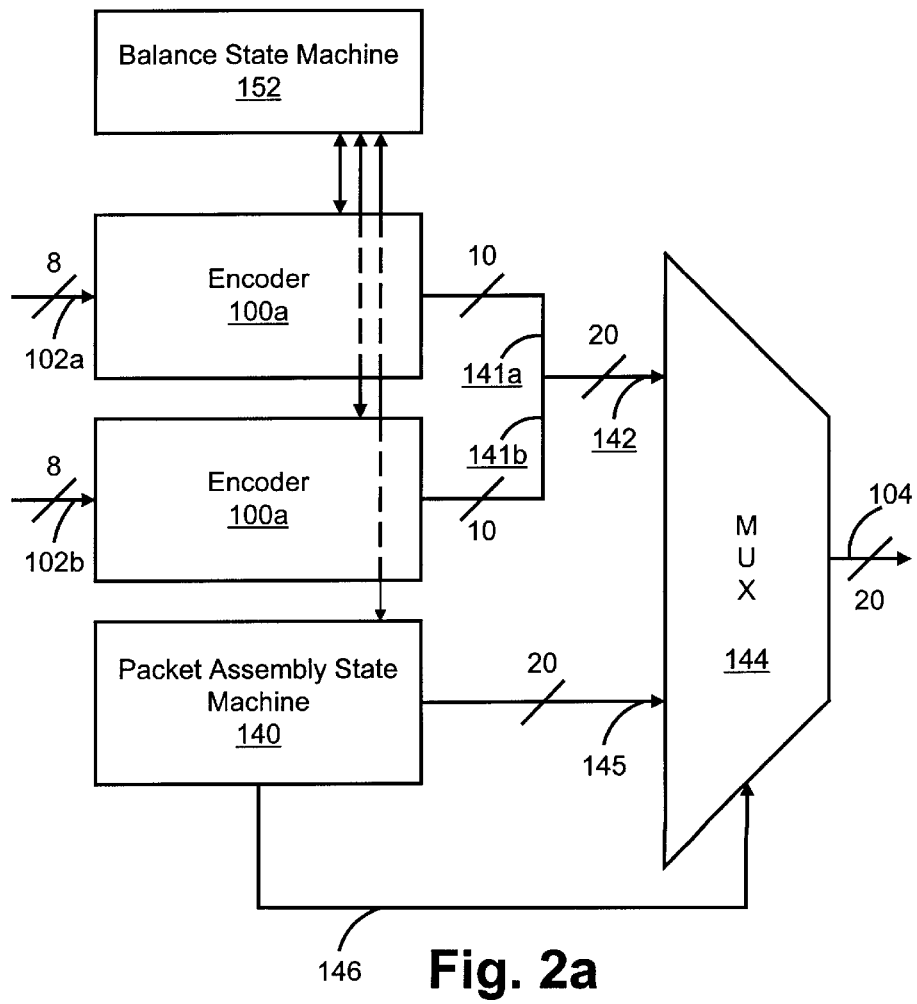
FIG. 2a is a block diagram of the encoding circuit of FIG. 1 employing two encoders in parallel to generate run length limited codes for transmission over a serial link.
Figure 2B:
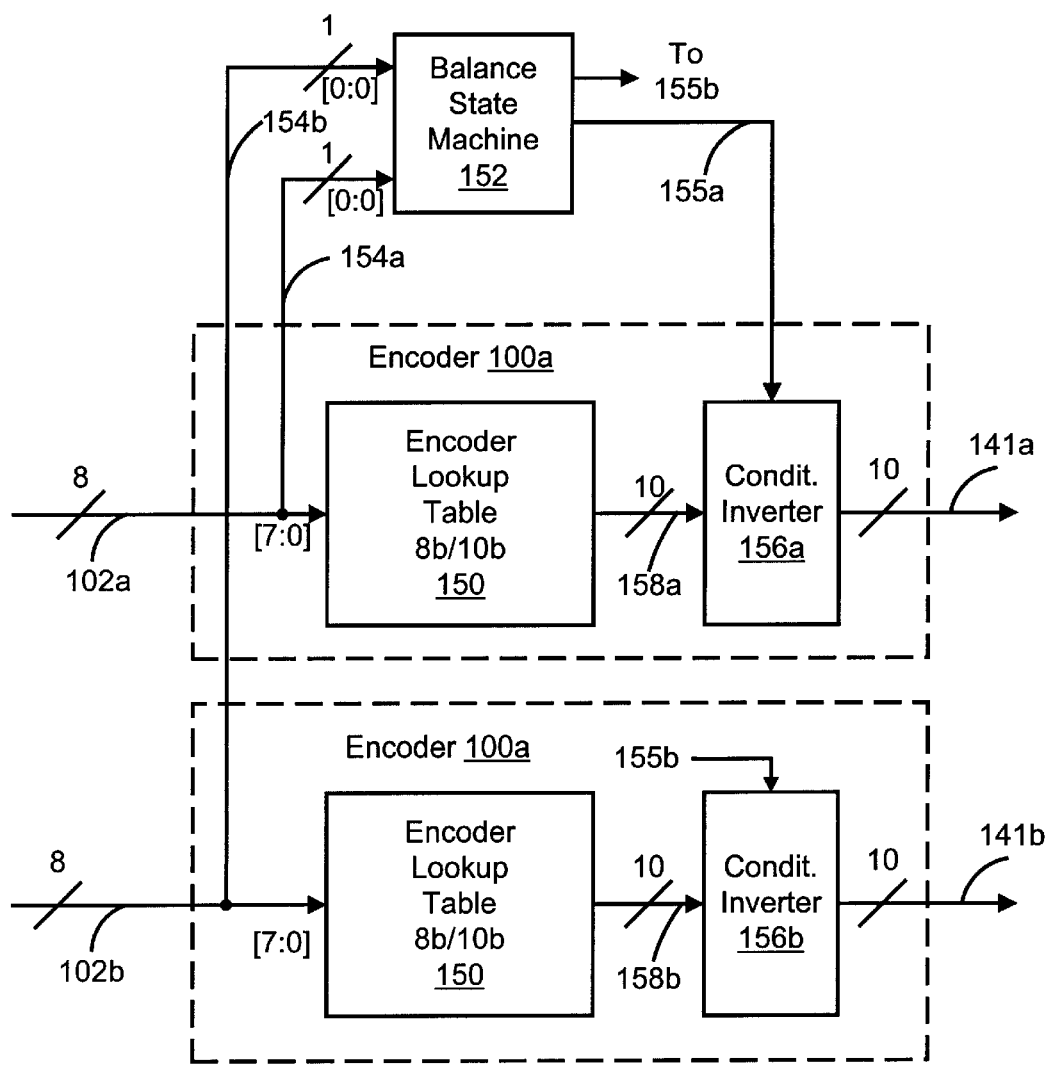
FIG. 2b is a block diagrams illustrating parallel encoders and a balance state machine employed in the encoding circuit of FIG. 1.

The operation of the encoder will be understood with more particularity by reference to FIGS. 1 and 2a. FIG. 2a depicts one embodiment of the encoding circuit 100 of FIG. 1. In the present embodiment, two eight bit characters are presented over input buses 102a and 102b to respective encoders 100a. Each of the encoders 100a receives the 8 bit data character on the respective input bus 102a, 102b and maps the received character into a corresponding RLL code. The respective encoders present as an output a 10 bit RLL code on the respective output buses 141a, 141b which may be non-inverted or inverted as hereinafter discussed. Referring to FIGS. 2a and 2b, each output bus 141a and 141b from the encoders 100a comprises a 10 bit output bus. An eight bit data character is provided over each of the input buses 102a, 102b to the respective encoders 100a and the respective 8 bit data character is employed to index into a map or lookup table 150 within the respective encoder 100a based upon the 8 bit value presented at the address inputs of the lookup table or map. The map may be in the form of a lookup table or alternatively, may comprise a memory such as a random access memory (RAM), a Read Only Memory (ROM), conversion logic embedded within an Application Specific Integrated Circuit (ASIC) or any other suitable logic for mapping the input values to the respective RLL codes.

The presently disclosed map or lookup table 150 within each encoder 100a contains run length limited 10 bit codes having a maximum run length of 5 binary 1s or 0s in sequence within the serial data stream (including sequences across character edge boundaries). Further, the values within the lookup tables 150 are selected so as to be balanced (i.e. 5 logic 1s and 5 logic 0s within the 10 bit code) or alternatively, to have a two bit imbalance with six logic 1s and 4 logic 0s. It is understood that the imbalanced codes could favor the opposite direction of imbalance, i.e. six logic 0s and 4 logic 1s. While it would be preferable to maintain DC balance within all 10 bit codes stored within the lookup table, there are insufficient numbers of such codes to provide 256 balanced codes as would be necessary with an 8 bit input. Accordingly, run length limited codes having a 2 bit imbalance are also employed. In the presently disclosed embodiment, the imbalanced codes are all imbalanced in the positive direction such that all imbalanced codes have six binary 1s and 4 binary 0s.

Furthermore, the run length limited codes are selectively stored within the lookup tables 150 of the respective encoders 100a such that the input addresses corresponding to balanced codes have the least significant bit equal to 0 and the input addresses corresponding to the imbalanced codes have the least significant bit equal to 1. By assigning codes within the lookup tables in this manner, a determination may be made as to whether a RLL code corresponding to a particular data character is balanced or imbalanced simply by inspecting the low order bit of the respective character.

DC balance is maintained within the serial data stream by inverting an imbalanced RLL code prior to transmission over the serial link if an imbalance existed at the time of receipt of the imbalanced character. A Balance State Machine 152 maintains a record of the state of balance of the serial transmission line. Upon initialization and prior to the transmission of characters over the serial data link 112, (including a sync character as hereinafter discussed) the Balance State Machine 152 is initialized either to 0 to indicate a state of balance or 1 to indicate a state of imbalance depending on whether the chosen Sync character is balanced or imbalanced, respectively. Accordingly, if the chosen Sync code is imbalanced, the Balance State Machine 152 will be set to a state of imbalance prior to the handling of the first RLL code within a packet. As indicated above, by inspecting the low order bit of the data character being presented to the respective lookup table 150, it may be determined whether the RLL code corresponding to that character is balanced or imbalanced, i.e. if the low order bit of the character is a zero, the corresponding RLL code is balanced and if the low order bit of the character is a one, the corresponding RLL code is imbalanced. The low order bit of the respective data character is coupled to the Balance State Machine 152 via signal lines 154a and 154b.

Table 1 below illustrates the operation of the Balance State Machine 152.

TABLE 1

Table 1 below illustrates the operation of the Balance State Machine 152.

| State Machine Input | Prior Balance State Machine State | Balance State Machine Output | New Balance State Machine State |
|---|---|---|---|
| Balanced | Balanced | Non-Inverting control | Balanced |
| Balanced | Imbalanced | Non-Inverting control | Imbalanced |
| Imbalanced | Balanced | Non-Inverting control | Imbalanced |
| Imbalanced | Imbalanced | Inverting control | Balanced |

Table 1

The transmissions over the serial data link 112 are either balanced or imbalanced by only 2 bits on a character by character basis. The Balance State Machine 152 generates output signals 155a and 155b which are coupled to and control the operation of conditional inverters 156a and 156b. The Lookup Table 150 outputs are coupled to the inputs of the conditional inverter 156a and 156b via data buses 158a and 158b respectively. If the Balance State Machine 152 output signal indicates that the RLL code from the respective Lookup Table 150 should not be inverted (non-inverting control), the respective conditional inverter passes the output of the respective Lookup Table 150 through the conditional inverter 156a or 156b, as applicable, unmodified. If the Balance State Machine 152 output signal 155 indicates that the RLL code from the respective Lookup Table 150 should be inverted to achieve balance following detection of an imbalanced state (inverting control), the respective conditional inverter 156a or 156b, as applicable, inverts the RLL code output from the respective Lookup Table 150 and presents the inverted RLL code to the MUX 144 over the respective 10 bit bus 141a or 141b. While the Balance State Machine 152 in the presently disclosed embodiment utilizes the low order bits of the 8 bit input characters as an input with appropriate RLL code assignments being made within the Lookup Tables 150, it should be appreciated that a separate bit could be provided within the Lookup Tables 150 to indicate whether the respective RLL codes are balanced or imbalanced or alternatively, a balance signal indicative of balance or imbalance for any particular code may be calculated from the RLL code itself and such balance signal may be employed as the input to the Balance State Machine 152 recognizing that timing adjustments may need to be made to run the encoder at high speeds.

The output of the MUX 144 comprises a 20 bit bus 104 which is coupled to the serializer 106. The MUX 144 is employed to select either encoded data from the encoders 100a as the operative input or alternatively, to select special characters and/or codes which are generated by a Packet Assembly State Machine (PASM) 140 as the operative input to the MUX 144. The output of the PASM 140 is coupled to the Multiplexer (MUX) 144 via bus 145. The MUX is selectively controlled via control lines 146 by the Packet Assembly State Machine 140 to produce the proper packet output sequence at the MUX 144 output 104.

Figure 2C:
FIG. 2c is a diagram of the packet data structure employed to transmit run length limited codes across the serial data link.

The packet data structure used for transmittal of the 10 bit RLL codes over the serial link 112 is depicted in FIG. 2c. Referring to FIG. 2c, the packet includes a Preamble field, a Sync character field, a data field and a postamble field. The Preamble comprises two and one-half twenty bit words (i.e. 50 bits) of alternating 1s and 0s ("1010 ... 1010") and serves to provide the phase locked loop with a sufficient transition density to rapidly achieve frequency lock on the received serial data stream. Since the Preamble has an equal number of 1s and 0s, the serial data stream is balanced following the transmission of the Preamble.

The Sync character comprises a special character which is employed to permit the receiver to obtain proper character alignment for the received data stream. In the present embodiment, the Sync character comprises one half of a twenty bit word (i.e. 10 bits) and has a sequence "0011111010". The Sync character is selected such that it is not one of the valid RLL codes applied to the decoding circuit 122. It is noted that the Sync character has six 1s and four 0s. Accordingly, the data stream is imbalanced positive by 2 bits following transmittal of the Sync character. For this reason, the Balance State Machine 152 is set to the imbalanced state upon the commencement of the transmittal of RLL codes. It should be appreciated that if a balanced Sync code were employed, the Balance State Machine 152 would be initialized to the balanced state prior to the commencement of transmittal of RLL codes over the serial link 112.

The Data field within the packet contains twenty-eight twenty bit words and can therefore accommodate fifty-six 10 bit RLL codes. It is possible for the last transmitted RLL code within the Data field to constitute an imbalanced code which would result in an imbalanced DC offset if such were not corrected. Similarly, if an imbalanced code resulted in an imbalanced state and was followed by one or more balanced codes through the end of the Data field, there would be a 2 bit DC offset.

The Postamble field is employed to correct for a DC offset in the event that a DC imbalance exists as of the end of the Data field. More specifically, if the serial data stream is balanced through the end of the Data field, the Postamble, which comprises a single 20 bit word, is transmitted as alternating 0s and 1s ("0101 0101 0101 0101 0101"). Accordingly, the serial data stream remains balanced at the end of the packet. Alternatively, if the serial data stream is unbalanced through the end of the data stream (i.e. 2 bits positive) the Postamble is transmitted as a series of alternating 0s ans 1s, however, the first "1" within the Postamble is transmitted as a 0, i.e. ("0001 0101 0101 0101 0101"). As a consequence, eleven 0s are transmitted and only nine ones are transmitted and the DC balance for the packet is restored. In the above described manner, the serial data stream is always DC balanced following transmission of a packet.

Figure 3:
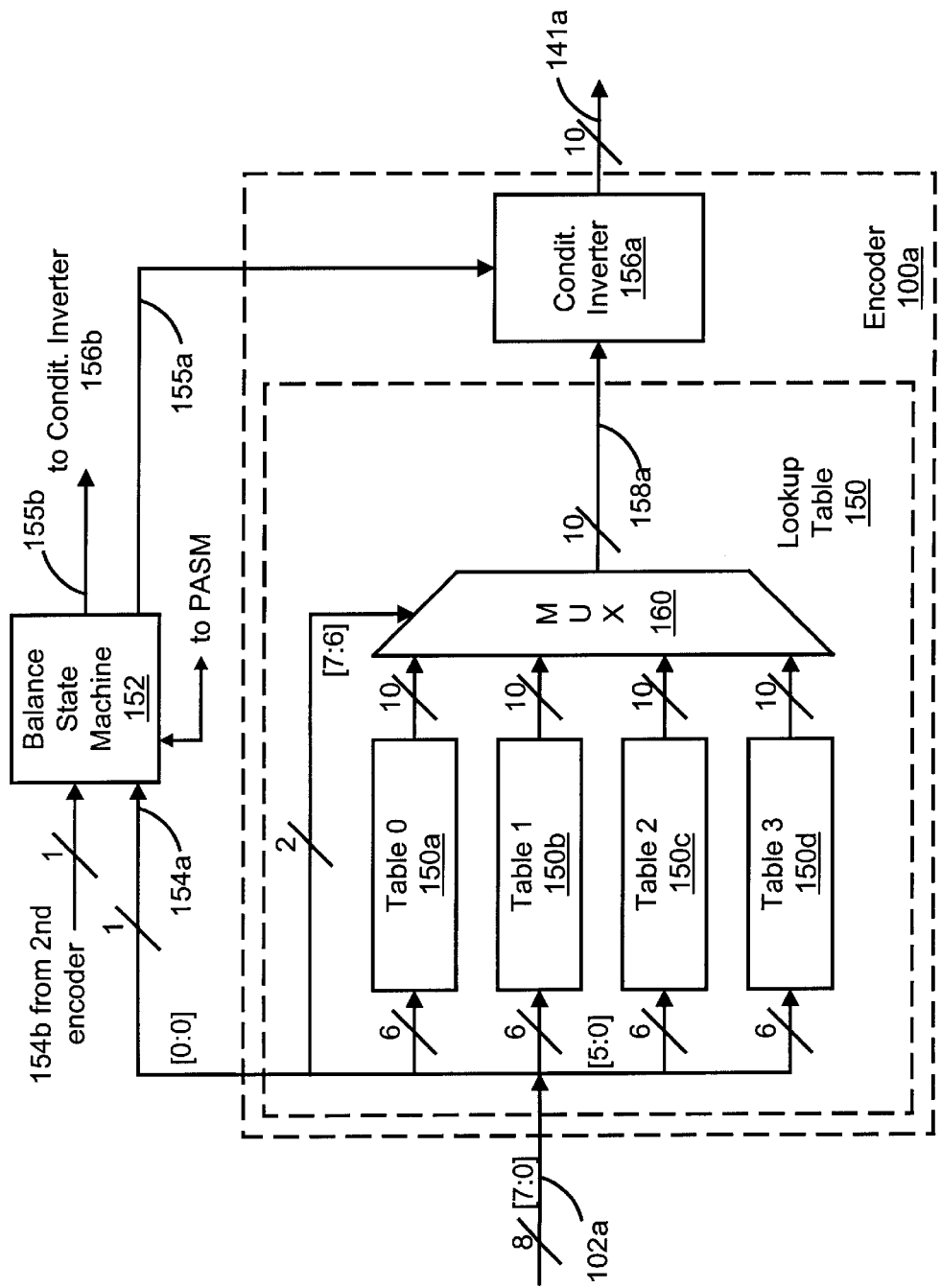
FIG. 3 is an alternative embodiment of one of the encoders illustrated in the encoding circuit of FIG. 2a in which plural memory lookup tables are used in the generation of 10 bit run length limited codes.

It may be desirable to implement the above described encoders 100a within an Application Specific Integrated Circuit (ASIC). Synthesis tools are more efficient generating a multiplicity of small tables rather than one large table such as the single lookup table 150 in each of the encoders 100a illustrated in FIG. 2b. To provide for more efficient ASIC synthesis, as illustrated in FIG. 3, the Lookup Table 150 is fabricated as a plurality of smaller tables with the upper two bits of the input data character being employed to select one of the plurality of lookup tables from which to obtain the respective RLL 10 bit code. More specifically, referring to FIG. 3, the Lookup Table in a preferred embodiment comprises Table 0 150a, Table 1 150b, Table 2 150c, Table 3 150d and a selection Multiplexer 160. The low order six bits [5:0] of the eight bit data character appearing on data bus 102a are used as an index into each of the four Lookup Tables 150a, 150b, 150c and 150d. The upper two bits [7:6] appearing on the eight bit data bus 102a are used to control the MUX 160 so as to select one of the Lookup Tables as the operative Lookup Table for the respective character and cause the appropriate 10 bit RLL code to be passed through the MUX 160 to the data bus 158a comprising the input to the conditional inverter 156. The Balance State Machine 152 receives as an input the low order bit [0:0] from the 8 bit data bus 102a and operates as discussed above in connection with FIGS. 2a and 2b. The conditional inverter 156a is controlled by signal line 155a which is driven by the Balance State Machine 152, also as discussed above in connection with FIG. 2b. While FIG. 3 depicts the first of the two encoders 100a illustrated in FIG. 2a, the second encoder 100a illustrated in FIG. 2a has the same structure depicted in FIG. 3 and operates in a similar manner.

Exemplary Lookup Tables which may be employed in the encoders of FIG. 2a and FIG. 3 are illustrated in FIGS. 5a, 5b, 5c and 5d. As depicted in the respective tables, the low order six bits of each data character map into respective 10 bit run length limited codes. The values of the RLL codes are selected such that all RLL codes are balanced which correspond to data characters having a low order bit of 0. Such is indicated in the Balance column of FIG. 5a for purposes of illustration. The balance indication within FIG. 5a does not form a part of the Lookup Table 150a. The Balance column reflects the difference between the number of 1s and 0s in the respective RLL code.

The RLL codes for the map or lookup table are determined as follows. First, the available 10 bit balanced RLL codes are selected and assigned. Next, 10 bit RLL codes are selected and assigned which are imbalanced in the positive direction by 2 bits (six logic 1s and 4 logic 0s) subject to the selection criteria that the selected RLL code must not exceed a predetermined run length limit (in the present case 5 bits). It is noted that within the respective RLL codes, the run length for the presently selected codes does not exceed 4 bits however, the run length across character boundaries reflects a run length limit of 5 bits.

The Packet Assembly State Machine 140 controls the MUX 144 via control lines 146 such that parallel output words from the MUX 144 which are presented to the Serializer 106 possess the packet data structure depicted in FIG. 2c. More specifically the Packet Assembly State Machine 140 first generates the Preamble code and applies the same to the MUX via the 20 bit wide bus 145. The PASM 140 next generates the Sync code and forwards the same to the MUX 144 over bus 145 packing all data on the 20 bit wide bus 145. The PASM next controls the MUX control lines 146 so as to couple the RLL code data from the encoders 100a to the MUX 144 via buses 141a and 141b (collectively forming bus 142) until 28 twenty bit words (or 56 RLL codes) have been transferred. Following the transmission of the RLL codes through the MUX 144, the PASM 140 controls the MUX control lines 146 so as to select the 20 bit PASM output bus 145 and the PASM 140 forwards the appropriate Postamble to assure DC Balance as of the completion of packet transmission. This process is repeated for the transmission of subsequent packets.

Figure 4:
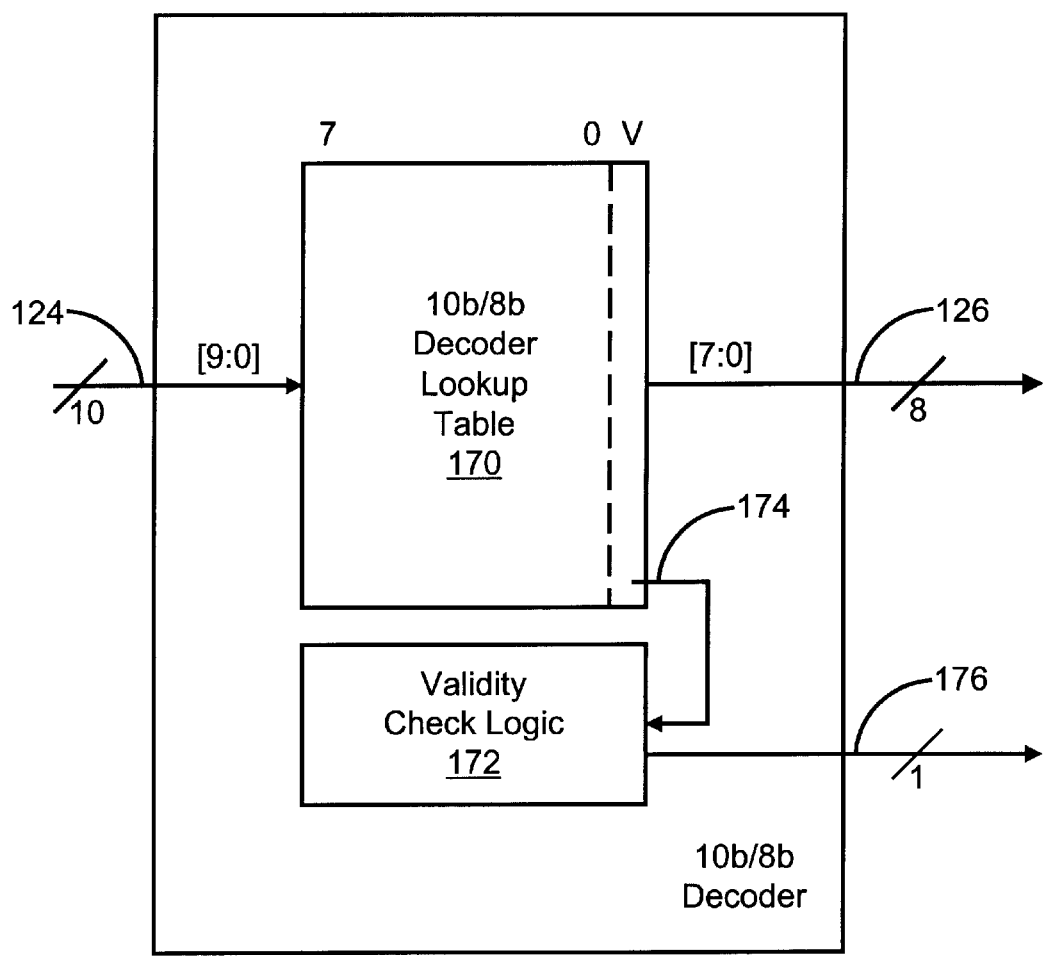
FIG. 4 is a block diagram of one of the 10b/8b decoders employed in the decoding circuit of FIG. 1.

The operation of the decoders employed for regenerating 8 bit data characters from the 10 bit RLL code will be more fully understood by reference to FIGS. 1 and 4. The serial 10 bit RLL codes are received by the receiver 114 and deserialized by the Deserializer 118 to produce a 20 bit parallel output word on data bus 124 corresponding to two 10 bit RLL codes. The data bus 124 constitutes the input to the decoder circuit 122. The decoder circuit 122 includes two decoders which operate in parallel on respective RLL codes presented at their inputs. FIG. 4 illustrates one of the two parallel decoders employed in the decoding circuit 122. Since the decoders are the same only one of the decoders is illustrated. Each decoder includes a 10b/8b Decoder Lookup Table 170 which maps each received RLL code into a corresponding 8 bit data character. Every balanced code is mapped into a unique 8 bit data character. Each imbalanced 10 bit RLL code and its complement are mapped into a single 8 bit data character to account for the fact that imbalanced RLL codes may be transmitted over the serial data link 112 in either non-inverted or inverted form. The Decoder Lookup Table 170 produces an output corresponding to the original 8 bit data character on an 8 bit decoder output bus 126.

The Decoder Lookup Table 170 further includes an indicator field in association with each data value within the Lookup Table 170 which indicates that the selected data value corresponds to a valid RLL code. More specifically, the indicator field comprises a single bit which is set to a logic 0 to indicate that the associated data value corresponds to a valid RLL code and is set to 1 to indicate that the associated data value corresponds to an invalid RLL code. Validity check logic 172 accesses the indicator field over signal line 174. A test is performed by validity check logic 172 to verify that the indicator field equals 0 and that associated data value corresponds to a valid RLL code. If the test of the indicator field reveals that the field is equal to 1, such is indicative of the fact that the respective RLL code has been erroneously received and an error signal 176 is generated.

An exemplary Decoder Lookup Table 170 is illustrated in FIGS. 6a–6e. One such Decoder Lookup Table 170 would be employed in each of the parallel decoders. The Decoder Lookup Table illustrated in FIGS. 6a–6e is intended to be employed in conjunction with the Encoder Lookup Tables illustrated in FIGS. 5a–5d. Thus, for example, referring to FIG. 5a, the eight bit input code '00000000' maps into the balanced 10 bit RLL output code '0001011011'. Referring to the first entry in FIG. 6a, the 10 bit RLL code '0001011011' maps back to the original data character '00000000'. Furthermore, by way of example, referring to FIG. 5a, the data character '00000001' maps into the imbalanced 10 bit RLL code '0001111011'. Referring to the second entry of FIG. 6a, both the non-inverted 10 bit RLL code '0001111011' and its complement '1110000100' map into the original 8 bit data character '00000001'. Upon reception of such a data character, the decoder lookup table presents an indicator field of a logic 0 to the validity check logic 172.

Figure 7:
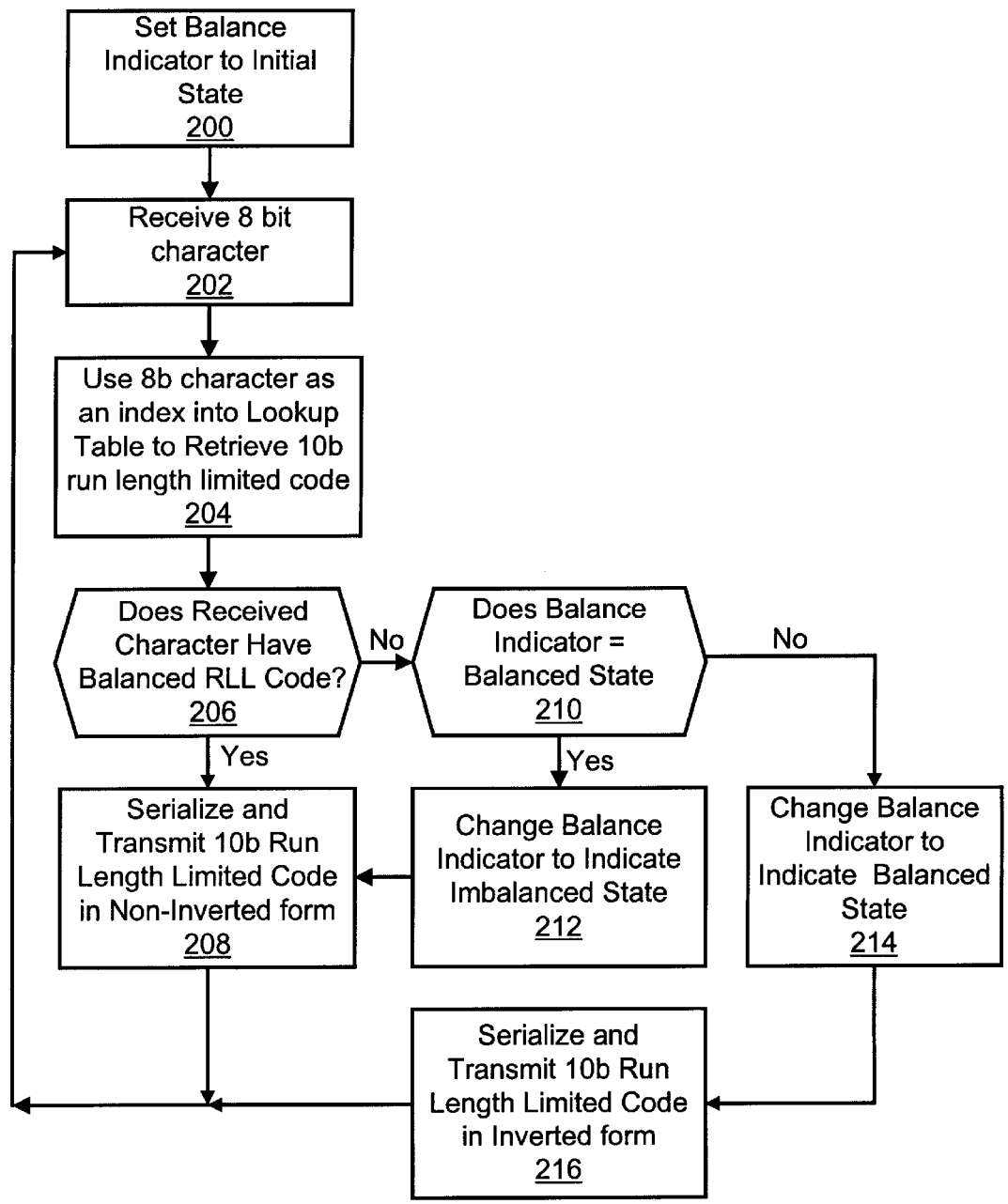
FIG. 7 is a flow diagram illustrating a method in accordance with the present invention for performing 8b/10b encoding.

The presently disclosed encoding method is further illustrated by reference to the flow diagram of FIG. 7. As illustrated in step 200, a balance indicator within the balance state machine is initialized to the proper balance state. An 8 bit (8b) data character is next received as depicted in step 202. The 8 bit data character is then used as an index into a lookup table to access a 10 bit (10b) RLL code corresponding to the received data character as shown in step 204. A determination is next made as to whether the received 8 bit character has a balanced or imbalanced 10 bit RLL code as depicted in inquiry step 206. If the received 8 bit character has a balanced RLL code, the RLL code is accessed, serialized and transmitted in non-inverted form as illustrated in step 208. Control next passes to step 202.

If the received character does not have a balanced RLL code as determined in inquiry step 206, a further inquiry is made, as illustrated in inquiry step 210 as to whether the Balance indicator within the Balance State Machine indicates a Balanced or Imbalanced state as a result of prior transmissions over the serial data link. If the Balance indicator indicates a Balanced State, the Balance Indicator is changed to indicate an Imbalanced State as shown in step 212 and the 10 bit imbalanced RLL code corresponding to the respective 8 bit character is serialized and transmitted over the serial data link in non-inverted form, as illustrated in step 208. Control then passes to step 202.

If, as a result of inquiry step 210 it is determined that the Balance Indicator within the Balance State Machine indicates an imbalanced state, the Balance Indicator is changed to Indicate a Balanced State as depicted in step 214. The respective 10 bit imbalanced RLL code is then inverted, serialized and transmitted over the serial data link as depicted in step 216. Control then passes to step 202 for encoding of a further data character.

While the presently illustrated encoder/decoder employs two encoders in parallel and two decoders in parallel to achieve desired operational speeds, it should be appreciated that a single encoder and a single decoder may be employed if clocked at a sufficiently high clock rate to achieve the desired encode and decode data rates.

It will be apparent to those of ordinary skill in the art that variations on and modifications of the above described encoder and decoder and methods for employing the same may be made without departing from the inventive concepts disclosed herein. Accordingly, the present invention is not to be viewed as limited except by the scope and spirit of the appended claims.

What is claimed is:

1. Encoding apparatus for converting a plurality of input values to a corresponding plurality of run length limited codes, wherein each of said input values comprises a plurality of bits, said encoding apparatus comprising:

a map for mapping said plurality of input values into said corresponding plurality of run length limited codes, wherein each one of said corresponding plurality of run length limited codes is either DC balanced or imbalanced in the same direction by the same magnitude, said map being indexed by said plurality of input values and operative to produce a single one of said run length limited codes, as a map output in response to the input of each one of said plurality of input values, wherein a single bit within a predetermined bit position of each one of said plurality of input values comprises an imbalance indicator bit having a first imbalance state or a second imbalance state, said run length limited codes being stored within said map such that each of said plurality of run length limited codes are imbalanced for input values having said imbalance indicator bit of said first imbalance state and balanced for input values having said imbalance indicator bit of said second imbalance state;

a DC balance controller, said controller receiving as an input said imbalance indicator bit, said DC balance controller being operative to produce an output signal having a first output state in the event that said run length limited codes previously output from said map for a given frame are cumulatively imbalanced and the imbalance indicator bit for the current input value to said map is of said first imbalance state, said DC balance controller otherwise being operative to produce an output signal having a second output state; and a conditional inverter in electrical communication with said map and operative to receive as inputs to said inverter said run length limited codes output from said map, said conditional inverter receiving said DC balance controller output signal and operative in response to detection of said DC balance controller output signal of said first output state to invert the respective run length limited code received by said conditional inverter, wherein the output of said conditional inverter comprises a parallel data word and said encoding apparatus further includes a data serializer having inputs coupled to the output of said conditional inverter, and wherein said data serializer is operative to produce an output comprising a serial data stream representative of a parallel data word appearing at the serializer inputs.

2. A method for mapping run length limited codes comprising the steps of:

selectively storing a plurality of balanced and imbalanced run length limited codes in a corresponding plurality of entries of a map, wherein each of said entries is indexed by a corresponding plurality of map index values, each of said map index values having at least one bit in a predetermined position which comprises an imbalance indicator bit, said imbalance indicator bit for each map index value having one of a first and second binary state, said run length limited codes being stored within said map such that imbalanced run length limted codes are stored as entries indexed by said map index values having said imbalance indicator bit of said first binary state and balanced run length limited codes are stored as entries indexed by said map index values having said imbalance indicator bit of said second binary state;

applying one of said map index values to said map to retrieve a corresponding one of said run length limited codes stored within said map;

retrieving one of said balanced run length limited codes from said map in response to the application of said one of said map index values in the event the respective map index value has an imbalance indicator bit of said second binary state; and retrieving from said map an imbalanced run length limited code from said map in response to the application of said one of said map index values in the event the respective map index value has an imbalance indicator bit of said first binary state.

3. The method of claim 2 wherein said map comprises at least one lookup table.

4. The method of claim 3 wherein said at least one lookup table comprises a plurality of lookup tables and said applying step comprises the step of applying one of said map index values to one of said at least one lookup table.

5. The method of claim 3 further comprising the step of determining whether the Run length limited code corresponding to the respective map index value is balanced or imbalanced in response to said imbalance indicator bit within said respective map index value.

6. The method of claim 2 wherein said imbalance indicator bit comprises the least significant bit of each one of said map index values.

7. The method of claim 5 wherein said imbalance indicator bit comprises the least significant bit of each map index value and said determining step comprises the step of testing the least significant bit of the respective map index value to determine whether such bit comprises a one or a zero.

8. A method for maintaining DC balance on a serial data link comprising the steps of:

transmitting a packet over a serial data link comprising a plurality of run length limited codes and an offset correction field;

determining whether said transmitted run length limited codes are cumulatively balanced;

transmitting a first offset correction field which is DC balanced in the event said determining step reveals that said transmitted run length limited codes are cumulatively DC balanced; and transmitting a second offset correction field which is selected to cause the packet to be DC balanced following transmission of said second offset correction field in the event said determining step reveals that said transmitted run length limited codes are cumulatively DC imbalanced, wherein said step of transmitting a packet comprises the step of transmitting said run length limited codes over said serial data link such that said transmitted run length limited codes are balanced or imbalanced in a known direction by a predetermined number of bits, and said step of transmitting a second offset correction field which is selected to cause the serial data link to be DC balanced following transmission of said second offset correction field in the event said determining step reveals that said serial data link is imbalanced comprises the step of transmitting a predetermined code over said serial data link which is imbalanced in a direction opposite from said known direction and imbalanced by said predetermined number of bits.

\* \* \* \* \*

UNITED STATES PATENT AND TRADEMARK OFFICE
CERTIFICATE OF CORRECTION

PATENT NO.    : 6,195,764 B1
DATED         : February 27, 2001
INVENTOR(S)   : Stephen A. Caldara et al.

It is certified that error appears in the above-identified patent and that said Letters Patent is hereby corrected as shown below:

<u>Column 3,</u>
Line 49, "is" should read -- 1's --; and

<u>Column 4,</u>
Line 47, "Os" should read -- 0s --.

Signed and Sealed this

Twelfth Day of March, 2002

*Attest:*

*Attesting Officer*

JAMES E. ROGAN
*Director of the United States Patent and Trademark Office*